United States Patent
Sharma et al.

(10) Patent No.: US 9,105,806 B2
(45) Date of Patent: Aug. 11, 2015

(54) POLARIZATION DIRECTION OF OPTICAL DEVICES USING SELECTED SPATIAL CONFIGURATIONS

(75) Inventors: Rajat Sharma, Fremont, CA (US); Eric M. Hall, Fremont, CA (US)

(73) Assignees: SORAA, INC., Fremont, CA (US); KAAI, INC., Goleta, CA (US)

( * ) Notice: Subject to any disclaimer, the term of this patent is extended or adjusted under 35 U.S.C. 154(b) by 261 days.

(21) Appl. No.: 13/553,691

(22) Filed: Jul. 19, 2012

(65) Prior Publication Data
US 2012/0288974 A1 Nov. 15, 2012

Related U.S. Application Data

(62) Division of application No. 12/720,593, filed on Mar. 9, 2010, now Pat. No. 8,247,886.

(60) Provisional application No. 61/158,622, filed on Mar. 9, 2009.

(51) Int. Cl.
*H01L 33/20* (2010.01)
*H01L 33/18* (2010.01)
*H01L 33/32* (2010.01)

(52) U.S. Cl.
CPC .................. *H01L 33/20* (2013.01); *H01L 33/18* (2013.01); *H01L 33/32* (2013.01)

(58) Field of Classification Search
CPC ..................................................... H01L 33/20
See application file for complete search history.

(56) References Cited

U.S. PATENT DOCUMENTS

| | | |
|---|---|---|
| 3,647,522 A | 3/1972 | Single |
| 4,065,688 A | 12/1977 | Thornton |
| 4,870,045 A | 9/1989 | Gasper et al. |
| 5,331,654 A | 7/1994 | Jewell et al. |
| 5,366,953 A | 11/1994 | Char et al. |
| 5,607,899 A | 3/1997 | Yoshida et al. |
| 5,632,812 A | 5/1997 | Hirabayashi |
| 5,685,885 A * | 11/1997 | Khandros et al. ............... 29/841 |
| 5,764,674 A | 6/1998 | Hibbs-Brenner et al. |
| 5,813,753 A | 9/1998 | Vriens et al. |
| 5,926,493 A | 7/1999 | O'Brien et al. |
| 6,069,394 A | 5/2000 | Hashimoto et al. |

(Continued)

FOREIGN PATENT DOCUMENTS

| | | |
|---|---|---|
| EP | 0961328 | 12/1999 |
| EP | 2381490 | 10/2011 |

(Continued)

OTHER PUBLICATIONS

Aguilar, 'Ohmic n-contacts to Gallium Nitride Light Emitting Diodes', National Nanotechnologhy Infrastructure Network, 2007, p. 56-81.

(Continued)

*Primary Examiner* — Evan Pert
(74) *Attorney, Agent, or Firm* — Saul Ewing LLP

(57) ABSTRACT

A GaN based light emitting diode device which emits polarized light or light of various degrees of polarization for use in the creation of optical devices. The die are cut to different shapes, or contain some indicia that are used to represent the configuration of the weak dipole plane and the strong dipole plane. This allows for the more efficient manufacturing of such light emitting diode based optical devices.

19 Claims, 8 Drawing Sheets

(56) References Cited

U.S. PATENT DOCUMENTS

| | | | |
|---|---|---|---|
| 6,072,197 A | 6/2000 | Horino et al. |
| 6,147,953 A | 11/2000 | Duncan |
| 6,195,381 B1 | 2/2001 | Botez et al. |
| 6,335,771 B1 | 1/2002 | Hiraishi |
| 6,379,985 B1 | 4/2002 | Cervantes et al. |
| 6,498,355 B1 | 12/2002 | Harrah et al. |
| 6,501,154 B2 | 12/2002 | Morita et al. |
| 6,509,651 B1 | 1/2003 | Matsubara et al. |
| 6,533,874 B1 | 3/2003 | Vaudo et al. |
| 6,547,249 B2 | 4/2003 | Collins, III et al. |
| 6,586,762 B2 | 7/2003 | Kozaki |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,809,781 B2 | 10/2004 | Setlur et al. |
| 6,858,882 B2 | 2/2005 | Tsuda et al. |
| 6,860,628 B2 | 3/2005 | Robertson et al. |
| 6,936,488 B2 | 8/2005 | D'Evelyn et al. |
| 6,956,246 B1 | 10/2005 | Epler et al. |
| 7,009,199 B2 | 3/2006 | Hall |
| 7,012,279 B2 | 3/2006 | Wierer, Jr. et al. |
| 7,019,325 B2 | 3/2006 | Li et al. |
| 7,128,849 B2 | 10/2006 | Setlur et al. |
| 7,285,801 B2 | 10/2007 | Eliashevich et al. |
| 7,303,630 B2 | 12/2007 | Motoki et al. |
| 7,341,880 B2 | 3/2008 | Erchak et al. |
| 7,348,600 B2 | 3/2008 | Narukawa et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,419,281 B2 | 9/2008 | Porchia et al. |
| 7,470,555 B2 | 12/2008 | Matsumura |
| 7,470,938 B2 | 12/2008 | Lee et al. |
| 7,483,466 B2 | 1/2009 | Uchida et al. |
| 7,489,441 B2 | 2/2009 | Scheible et al. |
| 7,491,984 B2 | 2/2009 | Koike et al. |
| 7,518,159 B2 * | 4/2009 | Masui et al. ............ 257/98 |
| 7,566,639 B2 * | 7/2009 | Kohda ............... 438/463 |
| 7,598,104 B2 | 10/2009 | Teng et al. |
| 7,622,742 B2 | 11/2009 | Kim et al. |
| 7,733,571 B1 | 6/2010 | Li |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,923,741 B1 | 4/2011 | Zhai et al. |
| 7,976,630 B2 | 7/2011 | Poblenz et al. |
| 8,044,412 B2 | 10/2011 | Murphy et al. |
| 8,142,566 B2 | 3/2012 | Kiyomi et al. |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| D662,899 S | 7/2012 | Shum et al. |
| D662,900 S | 7/2012 | Shum et al. |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,293,551 B2 | 10/2012 | Sharma et al. |
| 8,299,473 B1 | 10/2012 | D'Evelyn et al. |
| 8,304,265 B2 | 11/2012 | Nakamura et al. |
| 8,310,143 B2 | 11/2012 | Van De Ven et al. |
| 8,314,429 B1 | 11/2012 | Raring et al. |
| 8,324,835 B2 | 12/2012 | Shum |
| 8,350,273 B2 | 1/2013 | Vielemeyer |
| 8,351,478 B2 | 1/2013 | Raring et al. |
| 8,355,418 B2 | 1/2013 | Raring et al. |
| 8,455,894 B1 | 6/2013 | D'Evelyn et al. |
| 8,477,259 B2 | 7/2013 | Kubota et al. |
| 8,502,465 B2 | 8/2013 | Katona et al. |
| 8,524,578 B1 | 9/2013 | Raring et al. |
| 8,575,728 B1 | 11/2013 | Raring et al. |
| 8,597,967 B1 | 12/2013 | Krames et al. |
| 8,686,431 B2 | 4/2014 | Batres et al. |
| 8,786,053 B2 | 7/2014 | D'Evelyn et al. |
| 8,791,499 B1 | 7/2014 | Sharma et al. |
| 2001/0009134 A1 | 7/2001 | Kim et al. |
| 2001/0043042 A1 | 11/2001 | Murazaki et al. |
| 2001/0048114 A1 | 12/2001 | Morita et al. |
| 2001/0055208 A1 | 12/2001 | Kimura |
| 2002/0027933 A1 | 3/2002 | Tanabe et al. |
| 2002/0050488 A1 | 5/2002 | Nikitin et al. |
| 2002/0070416 A1 | 6/2002 | Morse et al. |
| 2002/0096994 A1 | 7/2002 | Iwafuchi et al. |
| 2002/0105986 A1 | 8/2002 | Yamasaki |
| 2002/0127824 A1 | 9/2002 | Shelton et al. |
| 2002/0155691 A1 | 10/2002 | Lee et al. |
| 2002/0182768 A1 | 12/2002 | Morse et al. |
| 2002/0190260 A1 | 12/2002 | Shen et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0047076 A1 | 3/2003 | Liu |
| 2003/0080345 A1 | 5/2003 | Motoki et al. |
| 2003/0164507 A1 | 9/2003 | Edmond et al. |
| 2003/0178617 A1 | 9/2003 | Appenzeller et al. |
| 2003/0216011 A1 | 11/2003 | Nakamura et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0196877 A1 | 10/2004 | Kawakami et al. |
| 2004/0207998 A1 | 10/2004 | Suehiro et al. |
| 2004/0245543 A1 | 12/2004 | Yoo |
| 2004/0251471 A1 | 12/2004 | Dwilinski et al. |
| 2005/0001227 A1 | 1/2005 | Niki et al. |
| 2005/0012446 A1 | 1/2005 | Jermann et al. |
| 2005/0045894 A1 | 3/2005 | Okuyama et al. |
| 2005/0087753 A1 | 4/2005 | D'Evelyn et al. |
| 2005/0109240 A1 | 5/2005 | Maeta et al. |
| 2005/0121679 A1 | 6/2005 | Nagahama et al. |
| 2005/0140270 A1 | 6/2005 | Henson et al. |
| 2005/0167680 A1 | 8/2005 | Shei et al. |
| 2005/0199899 A1 | 9/2005 | Lin et al. |
| 2005/0214992 A1 | 9/2005 | Chakraborty et al. |
| 2005/0224830 A1 | 10/2005 | Blonder et al. |
| 2005/0230701 A1 | 10/2005 | Huang |
| 2005/0232327 A1 | 10/2005 | Nomura et al. |
| 2005/0263791 A1 | 12/2005 | Yanagihara et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0077795 A1 | 4/2006 | Kitahara et al. |
| 2006/0079082 A1 | 4/2006 | Bruhns et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0186418 A1 | 8/2006 | Edmond et al. |
| 2006/0189098 A1 | 8/2006 | Edmond |
| 2006/0204865 A1 | 9/2006 | Erchak et al. |
| 2006/0205199 A1 | 9/2006 | Baker et al. |
| 2006/0213429 A1 | 9/2006 | Motoki et al. |
| 2006/0214287 A1 | 9/2006 | Ogihara et al. |
| 2006/0255343 A1 | 11/2006 | Ogihara et al. |
| 2006/0256482 A1 | 11/2006 | Araki et al. |
| 2006/0273339 A1 | 12/2006 | Steigerwald et al. |
| 2006/0288928 A1 | 12/2006 | Eom et al. |
| 2007/0045200 A1 | 3/2007 | Moon et al. |
| 2007/0054476 A1 | 3/2007 | Nakahata et al. |
| 2007/0062440 A1 | 3/2007 | Sato et al. |
| 2007/0072324 A1 | 3/2007 | Krames et al. |
| 2007/0093073 A1 | 4/2007 | Farrell et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0202624 A1 | 8/2007 | Yoon et al. |
| 2007/0210074 A1 | 9/2007 | Maurer et al. |

(56) References Cited

U.S. PATENT DOCUMENTS

| | | |
|---|---|---|
| 2007/0217462 A1 | 9/2007 | Yamasaki |
| 2007/0228404 A1 | 10/2007 | Tran et al. |
| 2007/0231978 A1 | 10/2007 | Kanamoto et al. |
| 2007/0264733 A1 | 11/2007 | Choi et al. |
| 2007/0280320 A1 | 12/2007 | Feezell et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121913 A1 | 5/2008 | McKenzie et al. |
| 2008/0128752 A1 | 6/2008 | Wu |
| 2008/0142781 A1 | 6/2008 | Lee |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0191192 A1 | 8/2008 | Feezell et al. |
| 2008/0191223 A1 | 8/2008 | Nakamura et al. |
| 2008/0194054 A1 | 8/2008 | Lin et al. |
| 2008/0198881 A1 | 8/2008 | Farrell et al. |
| 2008/0210958 A1 | 9/2008 | Senda et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0261381 A1 | 10/2008 | Akiyama et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2009/0028204 A1 | 1/2009 | Hiroyama et al. |
| 2009/0032828 A1 | 2/2009 | Romano et al. |
| 2009/0058532 A1 | 3/2009 | Kikkawa et al. |
| 2009/0065798 A1 | 3/2009 | Masui et al. |
| 2009/0071394 A1 | 3/2009 | Nakahata et al. |
| 2009/0072252 A1 | 3/2009 | Son et al. |
| 2009/0078944 A1 | 3/2009 | Kubota et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0095973 A1 | 4/2009 | Tanaka et al. |
| 2009/0140279 A1 | 6/2009 | Zimmerman et al. |
| 2009/0146170 A1 | 6/2009 | Zhong et al. |
| 2009/0155989 A1 | 6/2009 | Uematsu et al. |
| 2009/0194796 A1 | 8/2009 | Hashimoto et al. |
| 2009/0206354 A1 | 8/2009 | Kitano et al. |
| 2009/0227056 A1 | 9/2009 | Kyono et al. |
| 2009/0250686 A1 | 10/2009 | Sato et al. |
| 2009/0252191 A1 | 10/2009 | Kubota et al. |
| 2009/0267098 A1 | 10/2009 | Choi |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1 | 12/2009 | Raring et al. |
| 2009/0315480 A1 | 12/2009 | Yan et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0006876 A1 | 1/2010 | Moteki et al. |
| 2010/0025656 A1 | 2/2010 | Raring et al. |
| 2010/0032691 A1 | 2/2010 | Kim |
| 2010/0055819 A1 | 3/2010 | Ohba et al. |
| 2010/0067241 A1 | 3/2010 | Lapatovich et al. |
| 2010/0096615 A1 | 4/2010 | Okamoto et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0140634 A1 | 6/2010 | van de Ven et al. |
| 2010/0148145 A1 | 6/2010 | Ishibashi et al. |
| 2010/0149814 A1 | 6/2010 | Zhai et al. |
| 2010/0155746 A1 | 6/2010 | Ibbetson et al. |
| 2010/0195687 A1 | 8/2010 | Okamoto et al. |
| 2010/0200837 A1 | 8/2010 | Zimmerman et al. |
| 2010/0219505 A1 | 9/2010 | D'Evelyn |
| 2010/0220262 A1 | 9/2010 | DeMille et al. |
| 2010/0240158 A1 | 9/2010 | Ter-Hovhannissian |
| 2010/0276663 A1 | 11/2010 | Enya et al. |
| 2010/0290208 A1 | 11/2010 | Pickard |
| 2010/0295054 A1 | 11/2010 | Okamoto et al. |
| 2010/0295088 A1 | 11/2010 | D'Evelyn et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2011/0017298 A1 | 1/2011 | Lee |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0062415 A1 | 3/2011 | Ohta et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0075694 A1 | 3/2011 | Yoshizumi et al. |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0103418 A1 | 5/2011 | Hardy et al. |
| 2011/0108081 A1 | 5/2011 | Werthen et al. |
| 2011/0121331 A1 | 5/2011 | Simonian et al. |
| 2011/0124139 A1 | 5/2011 | Chang |
| 2011/0175200 A1 | 7/2011 | Yoshida |
| 2011/0177631 A1 | 7/2011 | Gardner et al. |
| 2011/0180781 A1 | 7/2011 | Raring et al. |
| 2011/0182056 A1 | 7/2011 | Trottier et al. |
| 2011/0186860 A1 | 8/2011 | Enya et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0220912 A1 | 9/2011 | D'Evelyn |
| 2011/0247556 A1 | 10/2011 | Raring et al. |
| 2011/0256693 A1 | 10/2011 | D'Evelyn et al. |
| 2011/0262773 A1 | 10/2011 | Poblenz et al. |
| 2011/0266552 A1 | 11/2011 | Tu et al. |
| 2011/0279054 A1 | 11/2011 | Katona et al. |
| 2011/0281422 A1 | 11/2011 | Wang et al. |
| 2011/0315999 A1 | 12/2011 | Sharma et al. |
| 2011/0317397 A1 | 12/2011 | Trottier et al. |
| 2012/0000415 A1 | 1/2012 | D'Evelyn et al. |
| 2012/0007102 A1 | 1/2012 | Feezell et al. |
| 2012/0043552 A1 | 2/2012 | David et al. |
| 2012/0073494 A1 | 3/2012 | D'Evelyn |
| 2012/0091465 A1 | 4/2012 | Krames et al. |
| 2012/0104412 A1 | 5/2012 | Zhong et al. |
| 2012/0118223 A1 | 5/2012 | D'Evelyn |
| 2012/0135553 A1 | 5/2012 | Felker et al. |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199841 A1 | 8/2012 | Batres et al. |
| 2012/0199952 A1 | 8/2012 | D'Evelyn et al. |
| 2012/0235201 A1 | 9/2012 | Shum |
| 2013/0022064 A1 | 1/2013 | Raring et al. |
| 2013/0022758 A1 | 1/2013 | Trottier |
| 2013/0026483 A1 | 1/2013 | Sharma et al. |
| 2013/0044782 A1 | 2/2013 | Raring |
| 2013/0064261 A1 | 3/2013 | Sharma et al. |
| 2013/0112987 A1 | 5/2013 | Fu et al. |
| 2013/0126902 A1 | 5/2013 | Isozaki et al. |

(56) References Cited

U.S. PATENT DOCUMENTS

| | | |
|---|---|---|
| 2013/0234108 A1 | 9/2013 | David et al. |
| 2014/0103356 A1 | 4/2014 | Krames et al. |
| 2014/0175492 A1 | 6/2014 | Steranka et al. |
| 2014/0346524 A1 | 11/2014 | Batres et al. |
| 2014/0346546 A1 | 11/2014 | D'Evelyn et al. |

FOREIGN PATENT DOCUMENTS

| | | |
|---|---|---|
| JP | 06-334215 | 12/1994 |
| JP | 1997-036430 | 2/1997 |
| JP | 09-082587 | 3/1997 |
| JP | 11-340507 | 12/1999 |
| JP | 11-340576 | 12/1999 |
| JP | 2001-160627 | 6/2001 |
| JP | 2001-177146 | 6/2001 |
| JP | 2002-185085 | 6/2002 |
| JP | 2003-031844 | 1/2003 |
| JP | 2000-294883 | 2/2004 |
| JP | 2006-173621 | 6/2006 |
| JP | 2007-110090 | 4/2007 |
| JP | 2008-084973 | 4/2008 |
| JP | 2008-172040 | 7/2008 |
| JP | 2008-311640 | 12/2008 |
| JP | 2009-21824 | 1/2009 |
| WO | WO 2006/062880 | 6/2006 |
| WO | WO 2009/001039 | 12/2008 |
| WO | WO 2010/138923 | 2/2010 |

OTHER PUBLICATIONS

Baker et al., 'Characterization of Planar Semipolar Gallium Nitride Films on Spinel Substrates', Japanese Journal of Applied Physics, vol. 44, No. 29, 2005, p. L920-L922.

Founta et al., 'Anisotropic Morphology of Nonpolar a-Plane GaN Quantum Dots and Quantum Wells', Journal of Applied Physics, vol. 102, vol. 7, 2007, p. 074304-1-074304-6.

Lu et al., 'Etch-Pits of GaN Films with Different Etching Methods', Journal of the Korean Physical Society, vol. 45, Dec. 2004, p. S673-S675.

Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.

Sato et al., 'High Power and High Efficiency Semipolar InGaN Light Emitting Diodes', Journal of Light and Visible Environment, vol. 32, No. 2, Dec. 13, 2007, p. 57-60.

Sato et al., 'Optical Properties of Yellow Light-Emitting Diodes Grown on Semipolar (1122) Bulk GaN Substrate', Applied Physics Letters, vol. 92, No. 22, 2008, p. 221110-1-221110-3.

Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.

Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, ARL-TR-4164, Jun. 2007, 18 pages.

Communication from the Japanese Patent Office re 2012-529969, dated Oct. 15, 2013, 6 pages.

Weaver et al., 'Optical Properties of Selected Elements', Handbook of Chemistry and Physics, 94th Edition, 2013-2014, p. 12-126-12-150.

USPTO Office Action for U.S. Appl. No. 12/491,169 dated Oct. 22, 2010 (9 pages).

USPTO Office Action for U.S. Appl. No. 12/491,169 dated May 11, 2011 (9 pages).

USPTO Office Action for U.S. Appl. No. 12/497,289 dated Feb. 2, 2012 (6 pages).

USPTO Notice of Allowance for U.S. Appl. No. 12/497,289 dated May 22, 2012 (7 pages).

USPTO Office Action for U.S. Appl. No. 12/785,953 dated Apr. 12, 2012 (11 pages).

USPTO Office Action for U.S. Appl. No. 12/785,953 dated Jan. 11, 2013 (14 pages).

USPTO Office Action for U.S. Appl. No. 12/785,953 dated Oct. 3, 2013 (10 pages).

USPTO Office Action for U.S. Appl. No. 12/880,803 dated Feb. 22, 2012 (8 pages).

USPTO Notice of Allowance for U.S. Appl. No. 12/880,803 dated Jul. 18, 2012 (5 pages).

USPTO Office Action for U.S. Appl. No. 12/995,946 dated Mar. 28, 2012 (17 pages).

USPTO Office Action for U.S. Appl. No. 12/995,946 dated Jan. 29, 2013 (25 pages).

USPTO Office Action for U.S. Appl. No. 12/995,946 dated Aug. 2, 2013 (15 pages).

USPTO Office Action for U.S. Appl. No. 13/019,897 dated Dec. 2, 2013 (17 pages).

USPTO Notice of Allowance for U.S. Appl. No. 13/281,221 dated Nov. 12, 2013 (10 pages).

USPTO Office Action for U.S. Appl. No. 13/328,978 dated Sep. 26, 2013 (25 pages).

USPTO Office Action for U.S. Appl. No. 13/548,635 dated Jun. 14, 2013 (5 pages).

USPTO Notice of Allowance for U.S. Appl. No. 13/548,635 dated Sep. 16, 2013 (6 pages).

USPTO Office Action for U.S. Appl. No. 13/548,770 dated Mar. 12, 2013 (5 pages).

USPTO Notice of Allowance for U.S. Appl. No. 13/548,770 dated Jun. 25, 2013 (6 pages).

USPTO Office Action for U.S. Appl. No. 13/629,366 dated Oct. 31, 2013 (7 pages).

USPTO Office Action for U.S. Appl. No. 13/723,968 dated Nov. 29, 2013 (23 pages).

Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, pp. L761-L763.

Feezell et al., 'AlGaN-Cladding-Free Nonpolar InGaN/GaN Laser Diodes', Japanese Journal of Applied Physics, vol. 46, No. 13, 2007, pp. L284-L286.

Haskell et al., 'Defect Reduction in (1100) m-plane gallium nitride via lateral epitaxial overgrowth by hydride vapor phase epitaxy', Applied Physics Letters 86, 111917 (2005), pp. 1-3.

Kojima et al., 'Stimulated Emission At 474 nm From an InGaN Laser Diode Structure Grown on a (1122) GaN Substrate', Applied Physics Letters, vol. 91, 2007, pp. 251107-251107-3.

Kubota et al., 'Temperature Dependence of Polarized Photoluminescence From Nonpolar m-Plane InGaN Multiple Quantum Wells For Blue Laser Diodes', Applied Physics Letter, vol. 92, 2008, pp. 011920-1-011920-3.

PCT Communication Including Partial Search and Examination Report for PCT/US2011/041106, dated Oct. 4, 2011, 4 pages total.

International Search Report of PCT Application No. PCT/US2011/041106, dated Jan. 5, 2012, 4 pages total.

Tsuda et al., 'Blue Laser Diodes Fabricated on m-Plane GaN Substrates', Applied Physics Express, vol. 1, 2008, pp. 011104-1-011104-3.

Tyagi et al., 'Semipolar (1011) InGaN/GaN Laser Diodes on Bulk GaN Substrates', Japanese Journal of Applied Physics, vol. 46, No. 19, 2007, pp. L444-L445.

USPTO Office Action for U.S. Appl. No. 12/478,736 dated Feb. 7, 2012 (6 pages).

USPTO Office Action for U.S. Appl. No. 12/634,665 dated Apr. 25, 2012 (9 pages).

USPTO Notice of Allowance for U.S. Appl. No. 12/720,593 dated Jul. 11, 2012 (7 pages).

USPTO Notice of Allowance for U.S. Appl. No. 12/785,953 dated Mar. 20, 2014 (8 pages).

USPTO Office Action for U.S. Appl. No. 12/861,765 dated Mar. 28, 2014 (12 pages).

USPTO Notice of Allowance for U.S. Appl. No. 13/012,674 dated Apr. 30, 2014 (8 pages).

USPTO Office Action for U.S. Appl. No. 13/019,897 dated Jun. 12, 2014 (8 pages).

(56) References Cited

OTHER PUBLICATIONS

USPTO Office Action for U.S. Appl. No. 13/304,182 dated May 9, 2014 (12 pages).
USPTO Office Action for U.S. Appl. No. 13/357,578 dated May 13, 2014 (8 pages).
USPTO Office Action for U.S. Appl. No. 13/629,366 dated Apr. 18, 2014 (7 pages).
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
Communication from the Korean Patent Office re 10-2012-7009980, dated Apr. 15, 2013, 6 pages.
USPTO Office Action for U.S. Appl. No. 12/569,841 dated Mar. 26, 2013.
USPTO Office Action for U.S. Appl. No. 12/749,466 dated Jul. 3, 2012.
USPTO Notice of Allowance for U.S. Appl. No. 12/936,238 dated Apr. 16, 2013.
USPTO Office Action for U.S. Appl. No. 13/019,897 dated Jan. 16, 2013.
USPTO Office Action for U.S. Appl. No. 13/328,978 dated May 15, 2013.
USPTO Office Action for U.S. Appl. No. 13/465,976 dated Dec. 20, 2012.
Motoki et al., 'Dislocation reduction in GaN crystal by advanced-DEEP', Journal of Crystal Growth, vol. 305, Apr. 1, 2007, pp. 377-383.
Communication from the Japanese Patent Office re 2013515583 dated Feb. 27, 2014, 2 pages.
USPTO Office Action for U.S. Appl. No. 12/569,841 dated Feb. 14, 2014, 20 pages.
USPTO Office Action for U.S. Appl. No. 13/012,674 dated Jan. 17, 2014, 15 pages.
Cich et al., 'Bulk GaN based violet light-emitting diodes with high efficiency at very high current density', Applied Physics Letters, 101, Nov. 29, 2012, pp. 223509-1-223509-3.
USPTO Office Action for U.S. Appl. No. 12/481,543 dated Jun. 27, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/749,476 dated Jun. 26, 2012.
USPTO Office Action for U.S. Appl. No. 12/861,765 dated Jul. 2, 2012.
USPTO Office Action for U.S. Appl. No. 12/879,784 dated Jan. 25, 2012.
USPTO Notice of Allowance for U.S. Appl. No. 12/879,784 dated Apr. 3, 2012.
USPTO Office Action for U.S. Appl. No. 12/880,889 dated Feb. 27, 2012.
USPTO Office Action for U.S. Appl. No. 12/880,889 dated Sep. 19, 2012.
USPTO Office Action for U.S. Appl. No. 12/936,238 dated Aug. 30, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/019,897 dated Mar. 30, 2012.
USPTO Notice of Allowance for U.S. Appl. No. 13/163,482 dated Jul. 31, 2012.
USPTO Office Action for U.S. Appl. No. 13/465,976 dated Aug. 16, 2012.
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Hanifin et al., 'Photoreception for Circadian, Neuroendocrine, and Neurobehavioral Regulation', Journal of Physiological Anthropology, vol. 26, 2007, pp. 87-94.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, pp. 1-2.
Rea et al., 'White Lighting', COLOR Research and Application, vol. 38, No. 2, Sep. 3, 2011, pp. 82-92.
USPTO Office Action for U.S. Appl. No. 12/569,841 dated Aug. 13, 2013, 21 pages.
USPTO Office Action for U.S. Appl. No. 12/861,765 dated Sep. 17, 2013, 10 pages.
USPTO Office Action for U.S. Appl. No. 13/281,221 dated Jun. 21, 2013, 6 pages.
Iso et al., 'High Brightness Blue InGaN/GaN Light Emitting Diode on Nonpolar m-Plane Bulk GaN Substrate,' Japanese Journal of Applied Physics, 2007, vol. 46, No. 40, pp. L960-L962.
USPTO Office Action for U.S. Appl. No. 12/569,841 dated Dec. 23, 2011.
USPTO Office Action for U.S. Appl. No. 12/569,844 dated Oct. 12, 2012.
USPTO Notice of Allowance for U.S. Appl. No. 12/569,844 dated Mar. 7, 2013.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
USPTO Office Action for U.S. Appl. No. 12/861,765 dated Mar. 7, 2013.
USPTO Office Action for U.S. Appl. No. 12/936,238 dated Jan. 30, 2013.
USPTO Office Action for U.S. Appl. No. 13/025,833 dated Jul. 12, 2012.
USPTO Office Action for U.S. Appl. No. 13/179,346 dated Aug. 17, 2012.
USPTO Office Action for U.S. Appl. No. 13/179,346 dated Dec. 13, 2012.
Mastro et al., 'Hydride vapor phase epitaxy-grown AlGaN/GaN high electron mobility transistors', Solid-State Electronics, vol. 47, Issue 6, Jun. 2003, pp. 1075-1079.
Morkoc, 'Handbook of Nitride Semiconductors and Devices', vol. 1, 2008, p. 704.
USPTO Office Action for U.S. Appl. No. 13/014,622 dated Jun. 20, 2014 (15 pages).
USPTO Notice of Allowance for U.S. Appl. No. 13/304,182 dated Aug. 27, 2014 (8 pages).
USPTO Office Action for U.S. Appl. No. 13/465,976 dated Aug. 25, 2014 (21 pages).
USPTO Office Action for U.S. Appl. No. 14/054,234 dated Aug. 14, 2014 (24 pages).
Enya, '531nm Green Lasing of InGaN Based Laser Diodes on Semi-Polar {20-21} Free-Standing GaN Substrates', Applied Physics Express, Jul. 17, 2009, vol. 2, pp. 082101.
Fujii et al., 'Increase in the Extraction Efficiency of GaN-Based Light-Emitting Diodes Via Surface Roughening', 2Applied Physics Letters, vol. 84, No. 6, 2004, pp. 855-857.
Kendall et al., 'Energy Savings Potential of Solid State Lighting in General Lighting Applications', Report for the Department of Energy, 2001, pp. 1-35.
International Search Report of PCT Application No. PCT/US2011/023622, dated Apr. 1, 2011, 2 pages total.
International Preliminary Report & Written Opinion of PCT Application No, PCT/US2011/037792, dated Dec. 6, 2012, 8 pages total.
Schmidt et al., 'High Power and High External Efficiency m-Plane InGaN Light Emitting Diodes', Japanese Journal of Applied Physics, vol. 46, No. 7, 2007, pp. L126-L128.

(56) References Cited

OTHER PUBLICATIONS

Shchekin et al., 'High Performance Thin-film Flip-Chip InGaN-GaN Light-Emitting Diodes', Applied Physics Letters, vol. 89, 2006, pp. 071109-1-071109-3.

Tyagi et al., 'High Brightness Violet InGaN/GaN Light Emitting Diodes on Sernipolar (1011) Bulk GaN Substrates', Japanese Journal of Applied Physics, vol. 46, No. 7, 2007, pp. L129-L131.

Communication from the German Patent Office re 11 2010 003 697.7 dated Apr. 11, 2013, (6 pages).

Communication from the Japanese Patent Office re 2012-529905 dated Apr. 19, 2013, (4 pages).

Communication from the Chinese Patent Office re 201180029188.7 dated Sep. 29, 2014 (7 pages).

Communication from the Japanese Patent Office re 2013-515583 dated Sep. 12, 2014 (4 pages).

Wierer et al., 'High-Power AlGaInN Flip-Chip Light-Emilting Diodes', Applied Physics Letters, vol. 78, No. 22, 2001, pp. 3379-3381.

Yamaguchi, 'Anisotropic Optical Matrix Elements in Strained GaN-Quantum Wells With Various Substrate Orientations', Physica Status Solidi (PSS), vol. 5, No. 6, 2008, pp. 2329-2332.

Yoshizumi et al., 'Continuous-Wave Operation of 520nm Green InGaN-Based Laser Diodes On . Semi- Polar {2021} GaN Substrates', Applied Physics Express, vol. 2, 2009, pp. 092101-1-092101-3.

USPTO Office Action for U.S. Appl. No. 12/883,652 dated Jan. 11, 2013 (11 pages).

USPTO Office Action for U.S. Appl. No. 12/942,817 dated Feb. 20, 2013 (11 pages).

USPTO Office Action for U.S. Appl. No. 13/019,897 dated Dec. 5, 2014 (18 pages).

USPTO Notice of Allowance for U.S. Appl. No. 13/108,645 dated Jan. 28, 2013 (8 pages).

USPTO Office Action for U.S. Appl. No. 13/291,922 dated Feb. 20, 2013 (9 pages).

USPTO Notice of Allowance for U.S. Appl. No. 13/425,304 dated Aug. 22, 2012 (7 pages).

USPTO Office Action for U.S. Appl. No. 13/425,354 dated Feb. 14, 2013 (12 pages).

USPTO Office Action for U.S. Appl. No. 13/606,894 dated Feb. 5, 2013 (7 pages).

USPTO Office Action for U.S. Appl. No. 14/181,386 dated Oct. 28, 2014 (10 pages).

USPTO Notice of Allowance for U.S. Appl. No. 14/301,520 dated Nov. 25, 2014 (8 pages).

* cited by examiner

POLARIZATION DIRECTION OF OPTICAL DEVICES USING SELECTED SPATIAL CONFIGURATIONS

CROSS-REFERENCES TO RELATED APPLICATIONS

This application is a divisional application of U.S. application Ser. No. 12/720,593 filed on Mar. 9, 2010 now U.S. Pat. No. 8,247,886, now allowed, which claims priority to U.S. Provisional Application No. 61/158,622, filed on Mar. 9, 2009, each of which is commonly assigned, and incorporated by reference herein for all purposes.

BACKGROUND OF THE INVENTION

The present invention relates generally to lighting techniques. More specifically, embodiments of the invention include techniques for the more efficient fabrication and handling of optical devices on semipolar or nonpolar crystalline semiconductor materials. Merely by way of example, the invention can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas and, which typically also contains mercury. A pair of electrodes is coupled between the halogen gas and couples to an alternating power source through a ballast. Once the gas has been excited, it discharges to emit light. Typically, the optically clear tube is coated with phosphors, which are excited by the light. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue and green color range for blue and green LEDs. The blue colored LEDs led to innovations such as solid state white lighting, the blue laser diode, which in turn enabled the BluRay™ DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. The performance of optoelectronic devices fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult. Furthermore, since increased indium content films often require reduced growth temperature, the crystal quality of the InGaN films is degraded. The difficulty of achieving a high intensity green LED has led scientists and engineers to the term "green gap" to describe the unavailability of such green LED. In addition, the light emission efficiency of conventional GaN-based LEDs drops off significantly at higher current densities, as are required for general illumination applications, a phenomenon known as "roll-over." Other limitations with blue LEDs using c-plane GaN exist. These limitations include poor yields, low efficiencies, and reliability issues. Although highly successful, solid state lighting techniques must be improved for full exploitation of their potential. These and other limitations may be described throughout the present specification and more particularly below.

From the above, it is seen that techniques for improving optical devices is highly desired.

BRIEF SUMMARY OF THE INVENTION

According to the present invention, optical techniques are provided. More specifically, embodiments of the invention include techniques for the more efficient fabrication, handling, and packaging of light emitting diode devices using gallium nitride containing materials. Merely by way of example, the invention can be applied to applications such as optoelectronic devices, and the like. Other applications that desire polarized emission include liquid crystal display ("LCD") backlighting, liquid crystal on silicon ("LCOS") lighting, selected applications of home and/or building lighting, medical applications, biological sampling, plant and algae growth, biofuels, microscopes, film and video (e.g., amusement, action, nature, in-door), multi-dimensional display or televisions, micro and/or pico displays, health and wellness, optical and/or data transmission/communication, security and safety, and others.

In a preferred embodiment, the present invention provides a light emitting diode device, commonly called an LED, e.g., single LED device, array of LEDs. The device has a GaN substrate comprising a shape including a width and a length, the width (W) and the length (L) being different in magnitude. The LED device is provided on the GaN substrate and configured to emit partially or fully polarized electromagnetic radiation. The polarized electromagnetic radiation comprises a weak dipole plane and a strong dipole plane, the weak dipole plane being orthogonal to the strong dipole plane, the strong dipole plane being parallel or perpendicular to the width of the GaN substrate.

In an alternative specific embodiment, the present invention provides a method for indicating a dipole configuration of an LED device provided on a GaN substrate. The method determines a dipole configuration of an LED device provided on a gallium nitride containing substrate, which is configured to emit electromagnetic radiation having a weak dipole plane and a strong dipole plane. In a specific embodiment, the method includes forming one or more indicia on the LED device or gallium nitride substrate to correlate either the weak dipole plane or the strong dipole plane to the one or more indicia. The method also includes spatially orienting the LED devices provided on a gallium nitride substrates using at least the one or more indicia on the LED device provided on a gallium nitride substrate.

In still other embodiments, the present invention provides an optical device, e.g., LED array. The device has two or more GaN substrates configured in a package. Each of the GaN substrates is characterized by a shape including a width and a length, the width (W) and the length (L) being different in magnitude. An LED device is provided on each of the GaN substrates. The LED device is configured to emit partially or fully polarized electromagnetic radiation. The polarized electromagnetic radiation comprises a weak dipole plane and a strong dipole plane. In a preferred embodiment, the length and width are characterized by an aspect ratio of 1.1, 1.2, 1.3, 1.4, 1.5 and greater, or can be slightly less in some embodiments.

In one or more embodiments of the present invention, a method is provided for determining the strong and weak dipole planes of an LED die on a bulk semi-polar or non-polar GaN substrate used for an optical device. Specifically the dies are cut with at least one side of the die being different in length or shape than other sides of the die, in order to serve as a marker indicating the strong and weak dipole planes of the bulk GaN substrate material.

In an alternative specific embodiment, the die is cut into a rectangular shape. The die is cut from the wafer in such a manner that either the side of shorter length or the side of longer length indicates the strong and weak dipole planes of the GaN substrate material.

In another specific embodiment of the present invention, one side of the die is cut at an angle such that the side is not perpendicular to opposing parallel sides of the die. Such side thereby serves as indicia representing the strong or weak dipole plane of the GaN substrate material.

In another specific embodiment of the present invention, the die can be cut into any shape that is used to distinguish configuration of the strong and weak dipole planes.

In an alternate embodiment of the present invention a mark or feature is made on either of the larger surface area faces of the die, serving as indicia representing the configuration of the strong and weak dipole planes of the GaN substrate material, upon which the LEDs are built upon.

In another set of embodiments of the present invention, the method of determining the configuration of the strong and weak dipole planes of the die is used when combined with multiple die in an optical device in order to maximize light intensity.

In an alternate embodiment of the present invention, the method of determining the configuration of the strong and weak dipole planes of the die is used when combined with multiple die in an optical device in order to create a device capable of simultaneously emitting light of varying intensity levels.

Benefits are achieved by the present invention over conventional techniques. In one or more embodiments, the present device and method can provide a spatial orientation that is easily detectable for handling and packaging of die having strong and/or weak dipole planes. In other embodiments, the present device and method can be achieved using conventional technologies of scribing, breaking, and/or sawing/singulating. Preferably, the shaped die can be configured along with other die to form an array configuration. The array configuration is characterized by a system efficiency that is often higher than conventional unpolarized LEDs using c-plane GaN substrates in applications, which desire polarized emission. Depending upon the embodiment, one or more of these benefits may be achieved. These and other benefits are further described throughout the present specification and more specifically below.

The present invention achieves these benefits and others in the context of known process technology. However, a further understanding of the nature and advantages of the present invention may be realized by reference to the latter portions of the specification and attached drawings.

DETAILED DESCRIPTION OF THE INVENTION

Figure 1:
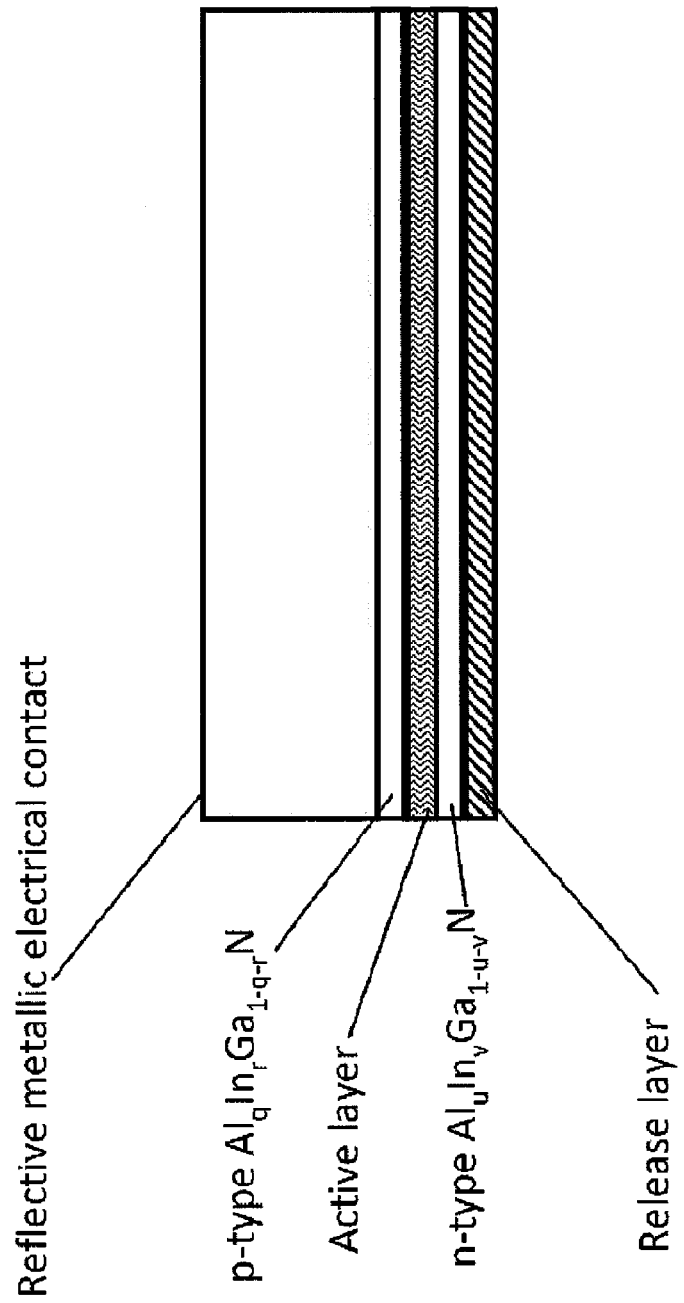
FIG. 1 shows a simplified diagram of a cross sectional view of a sample LED device structure fabricated on a bulk GaN substrate wafer according to an embodiment of the present invention.

According to the present invention, methods and devices for the more efficient fabrication of optical devices are provided. More specifically, methods and devices for determining the configuration of the strong and weak emission dipole planes of the die made from GaN materials are provided. Merely by way of example, the invention can be applied to applications such as optoelectronic devices, and the like. Other applications that desire polarized emission include liquid crystal display ("LCD") backlighting, liquid crystal on silicon ("LCOS") lighting, selected applications of home and/or building lighting, medical applications, biological sampling, plant and algae growth, biofuels, microscopes, film and video (e.g., amusement, action, nature, in-door), multi-dimensional display or televisions, micro and/or pico displays, health and wellness, optical and/or data transmission/communication, security and safety, and others.

While conventional optical devices have been fabricated on the c-plane of GaN substrates, researchers are exploring the properties of optical devices fabricated on m-plane GaN substrates. Specifically c-plane bulk GaN is polar, while m-plane bulk GaN is non-polar along the growth direction. LEDs fabricated on the m-plane of bulk GaN substrates can emit highly polarized light. By utilizing non-polar GaN substrate-based LEDs in applications which require polarized light (such as LCD back-lighting), improved system efficiencies can therefore be achieved. Furthermore, optical devices are also fabricated from GaN substrates wherein the largest area surface is angled from the polar c-plane leading to semipolar bulk GaN substrates. LEDs fabricated on bulk semipolar GaN substrates can also emit partially polarized light according to other embodiments. The degree of polarization of the emission can be related to the crystallographic orientation of the largest surface area of the bulk GaN substrate, the composition and constitution of the individual layers that make up the LED structure, the electrical current density at which the polarization ratio is measured, how the measurement occurs, among other factors. Regarding the measurement, complex equipment including selected polarizers, photodetectors, and handling techniques are often required to determine the degree of polarization. The use of non-polar or semi-polar GaN in the fabrication of LEDs allows for the creation of optical devices that produce light of various levels of polarization.

In order to maximize system efficiencies in end-applications for GaN LEDs with partially polarized emission, it is desirable in device manufacturing to know the orientations of the strong and weak emission dipole planes relative to largest surface area (or other surface area) of the LED chips fabricated from both non-polar and semi-polar bulk GaN substrates. As background information, non-polar and semi-polar bulk GaN substrates are available in wafer form, and are subsequently singulated into individual die following epitaxial growth and device wafer-level device fabrication. In wafer form, the orientations of the strong and weak dipole planes relative to the wafer's major and minor axes may be easily determined, by recording the emission intensity from an individual LED device with a polarizing optic placed between the device and a detector, for a sufficiently large number of angular orientations of the polarizing optic, as shown in FIG. 1A—the orientation of the strong emission dipole is then simply represented by the angular orientation of the polarizing optic at which the measured emission intensity is the strongest, with the weak emission dipole orientation being orthogonal to the strong emission dipole orientation. Typically, the LED devices are oriented relative to the substrate surface such that the orthogonal strong and weak dipole orientations are aligned to the edges of the individual LED chips. However, after singulation into individual LED die with typical square or similar geometries with high rotational symmetry, it can be extremely difficult, cumbersome, if not impossible, to keep track of the strong and weak dipole plane orientations for individual LED chips.

In order to maximize multi-LED system efficiency, the proper polarization field direction of individual die must often be easily determined during the packaging and assembly of the optical devices. In one or more embodiments, the strength of the dipole plane is related to a spatial feature of the individual die. In a specific embodiment, the spatial feature corresponding to either the strong or weak dipole of the individual die can be aligned in a desired configuration. In handling or packaging each individual die, it can be oriented along a preferred spatial orientation until the strong or weak dipole plane is aligned in a desired configuration in a specific embodiment. In alternative embodiments, the selected dipole can be aligned with a secondary optic, which can have a polarizing or non-polarizing property. In still other alternative embodiments, the selected dipole can be aligned with an Nth optic, where N is greater than 2 for general application. Of course, there can be other variations, modifications, and alternatives.

Figure 1A:
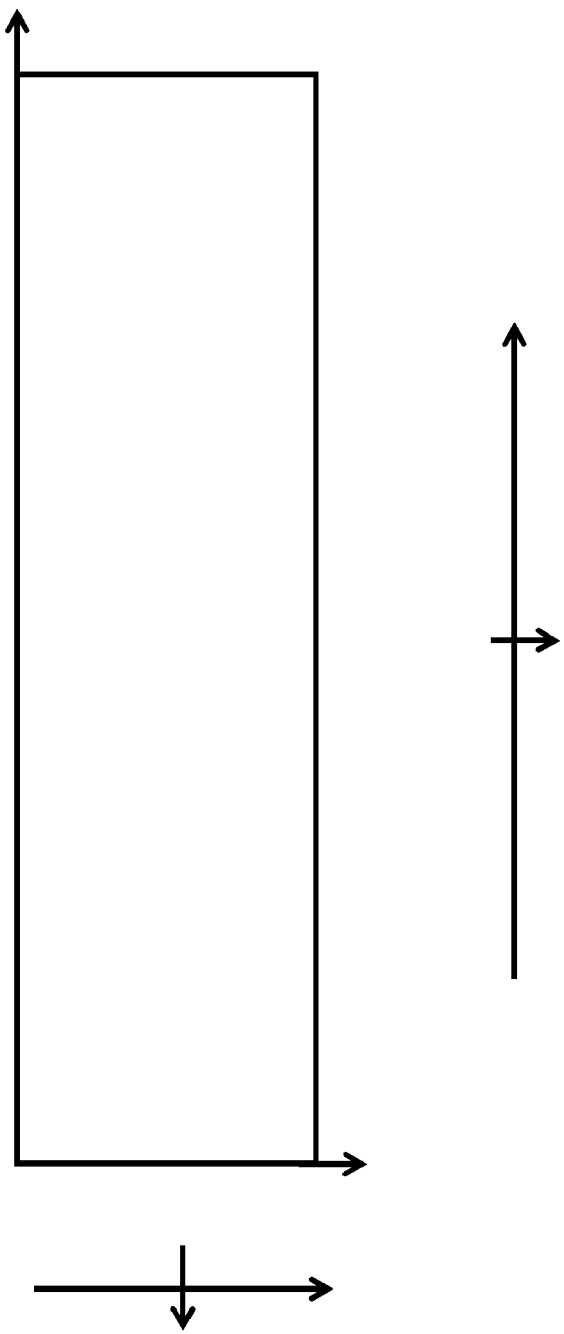
FIG. 1A is a simplified diagram illustrating one or more orientations of the strong and weak dipole planes relative to the wafer's major and minor axes by recording the emission intensity from an individual LED device with a polarizing optic placed between the device and a detector for a sufficiently large number of angular orientations of the polarizing optic.

FIG. 1 shows a sample LED device fabricated on a bulk GaN substrate wafer. This diagram is merely an example, which should not unduly limit the scope of the claims herein. One of ordinary skill in the art would recognize other variations, modifications, and alternatives. The substrate of the wafer includes a high quality nitride crystal with a release layer, as disclosed in U.S. Patent application 61/091,591, entitled, "Nitride crystal with release layer, method of making, and method of use," commonly assigned, and which is hereby incorporated by reference in its entirety. The nitride crystal comprises nitrogen and has a surface dislocation density below $10^5$ cm$^{-2}$. The nitride crystal or wafer may comprise $Al_xIn_yGa_{1-x-y}N$, where 0≤x, y, x+y≤1. In one specific embodiment, the nitride crystal comprises GaN. In a preferred embodiment, the nitride crystal is substantially free of low-angle grain boundaries, or tilt boundaries, over a length scale of at least 3 millimeters. The nitride crystal has a release layer with an optical absorption coefficient greater than 1000 cm$^{-1}$ at least one wavelength where the base crystal underlying the release layer is substantially transparent, with an optical absorption coefficient less than 50 cm-1, and may further comprise a high quality epitaxial layer, which also has a surface dislocation density below 105 cm-2. The release layer may be etched under conditions where the nitride base crystal and the high quality epitaxial layer are not.

The substrate may have a large-surface orientation within ten degrees, within five degrees, within two degrees, within one degree, within 0.5 degree, or within 0.2 degree of (0 0 0 1), (0 0 0-1), {1-1 0 0}, {1 1-2 0}, {1-1 0±1}, {1-1 0±2}, {1-1 0±3}, or {1 1-2±2}. The substrate may have a dislocation density below $10^4$ cm$^{-2}$, below $10^3$ cm$^{-2}$, or below $10^2$ cm$^{-2}$. The nitride base crystal or wafer may have an optical absorption coefficient below 100 cm$^{-1}$, below 50 cm$^{-1}$ or below 5 cm$^{-1}$ at wavelengths between about 465 nm and about 700 nm. The nitride base crystal may have an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm.

In one or more embodiments, the device can be configured with an optional release layer. The release layer comprises heavily cobalt-doped GaN, has a high crystal quality, and is substantially black, with an optical absorption coefficient greater than 1000 cm$^{-1}$ or greater than 5000 cm$^{-1}$ across the visible spectrum, including the range between about 465 nm and about 700 nm. The release layer is between about 0.05 micron and about 50 microns thick and has a temperature stability approximately the same as the underlying base crystal and exhibits minimal strain with respect to the underlying base crystal.

An n-type $Al_uIn_vGa_{1-u-v}N$ layer, where 0≤u, v, u+v≤1, is deposited on the substrate. The carrier concentration may lie in the range between about $10^{17}$ cm$^{-3}$ and $10^{20}$ cm$^{-3}$. The deposition may be performed using metal organic chemical vapor deposition (MOCVD) or molecular beam epitaxy (MBE).

Following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type layer. The well layers and barrier layers may each have a thickness between about 1 nm and about 20 nm. In another embodiment, the active layer comprises a double heterostructure, with an InGaN or $Al_wIn_xGa_{1-w-x}N$ layer about 20 nm to about 500 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

Next, a p-type doped $Al_qIn_rGa_{1-q-r}N$, where $0 \leq q, r, q+r \leq 1$, layer is deposited above the active layer. The p-type layer may be doped with Mg, to a level between about $10^{17}$ cm$^{-3}$ and $10^{21}$ cm$^{-3}$, and may have a thickness between about 5 nm and about 500 nm. The outermost 1-30 nm of the p-type layer may be doped more heavily than the rest of the layer, so as to enable an improved electrical contact.

A reflective electrical contact, with a reflectivity greater than about 70%, is then deposited on the p-type semiconductor layer or on the second n-type layer above a tunnel junction, if it is present. In another embodiment, the reflective electrical contact is placed on the n-type side of the device structure. In a preferred embodiment, the reflectivity of the reflective electrical contact is greater than 80% or greater than 90%. The reflective electrical contact may comprise at least one of silver, gold, aluminum, nickel, platinum, rhodium, palladium, chromium, or the like. The reflective electrical contact may be deposited by thermal evaporation, electron beam evaporation, sputtering, or another suitable technique. In a preferred embodiment, the reflective electrical contact serves as the p-type electrode for the textured-surface LED. In another embodiment, the reflective electrical contact serves as an n-type electrode for the textured-surface LED. Further details of the present invention are found throughout the present specification and more particularly below. Of course, there can be other variations, modifications, and alternatives.

Figure 2:
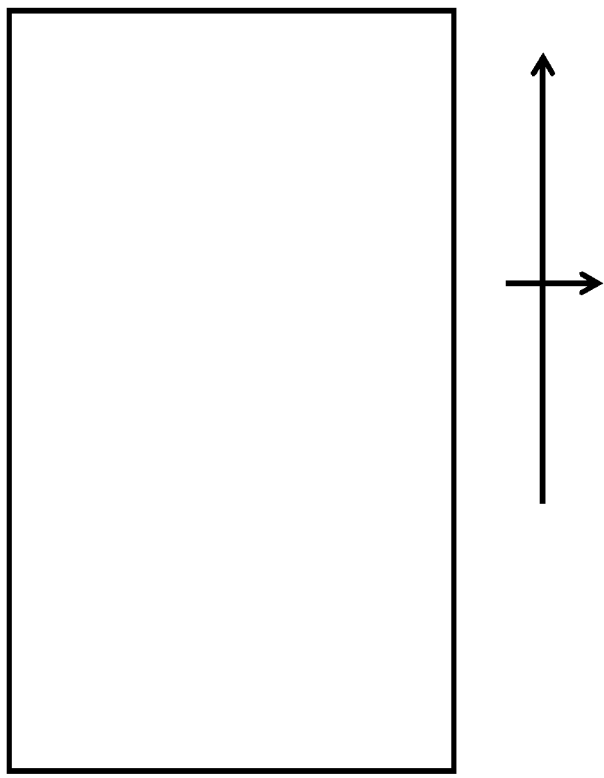
FIG. 2 shows a simplified diagram of a top view of a conventional square die including the configuration of the strong and weak dipole planes.

To further understand the present method and structures, FIG. 2 shows a top view of a conventional square shaped die with the configuration of the strong and weak dipole planes. After the LED structures of FIG. 1 are created on the bulk GaN substrate wafer, the wafer is then cut into individual die, typically in the shape of a square, which we discovered led to limitations in packaging and orienting the die in a desired manner. While the configuration of the strong and weak dipole planes of the bulk GaN substrate wafer may be known while the substrate is in wafer form, once the wafer has been processed and singulated to form a plurality of individual die including one or more optical devices, such planes are no longer known by visual inspection of the individual square dice. As a result, in order to determine the polarization field direction, a person must often manually tests and reorient in a trial and error basis each die in order to determine the configuration of the strong and weak dipole planes. Accordingly, conventional square shaped die have limitations in handling and lead to inefficiencies in packaging and the like.

Figure 3:
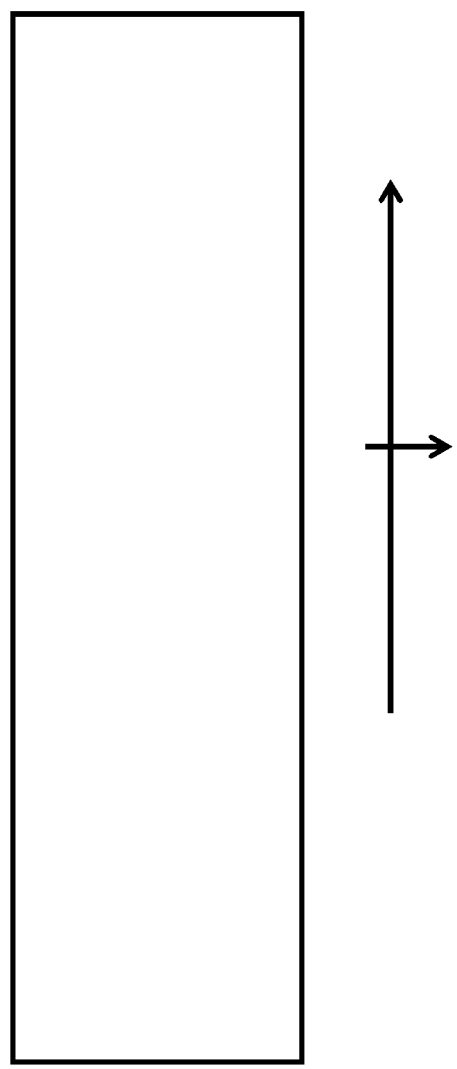
FIG. 3 shows a simplified diagram of a top view of a rectangular cut die used to indicate the configuration of the strong and weak dipole planes.

FIG. 3 shows a top view of a rectangular die of the present invention with the configuration of the strong and weak dipole planes according to an embodiment of the present invention. Cutting the die from the wafer in a rectangular shape provides a visible configuration that can represent the configuration of such planes. Specifically, since the configuration of the strong and weak dipole planes of the wafer is known, all of the die can be cut in a rectangular shape such that the longer side of the rectangle indicates the configuration of the strong and weak dipole planes. Alternatively, the die can be cut in a rectangular shape such that the shorter side indicates the configuration of such planes. Regardless of which side is used to represent the configuration of the strong and weak dipole planes, upon removal from the wafer, such configuration is known by visual inspection. This allows a user to quickly determine what the dipole plane configuration is and thereby more efficiently create optical devices using the die for purposes of handling and packaging. Of course, there can be other variations, modifications, and alternatives.

Figure 4:
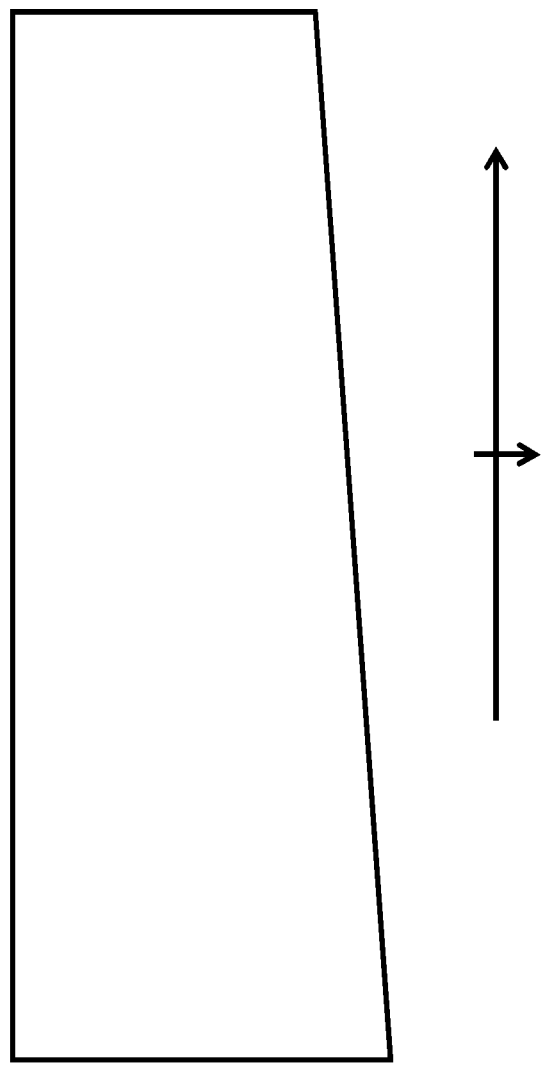
FIG. 4 shows a simplified diagram of a top view of a die with one side cut at an angle to indicate the configuration of the strong and weak dipole planes according to an embodiment of the present invention.

FIG. 4 shows a top view of a die of the present invention with one side cut at an angle and the configuration of the strong and weak dipole planes according to an embodiment of the present invention. Similar to the rectangular shape, alternatively, one side of the die can be cut at an angle when cutting the die from wafer, thereby providing a visible configuration that represents the configuration of the strong and weak dipole planes. In this embodiment of the invention, any side can be used to the dipole plane configuration. For example the angled side can be used, or the side opposing the angle side can be used to indicate the dipole planes. Likewise, the shorter of the parallel sides or the longer of the parallel sides can be used to indicate the dipole planes. Of course, there can be other variations, modifications, and alternatives.

In theory any non-square shaped die can be used as an indicator of the configuration of the strong and weak dipole planes of the individual die. All that is required is that each die is cut in the same configuration from the wafer so that the visual indication of the dipole planes remains constant amongst all of the die that are cut from the wafer. The shape of the die that is used to represent the dipole plane configuration is completely dependent on the fabrication process, and what shape is most effective and well suited for the resulting optical devices that are fabricated from such die.

Figure 5:
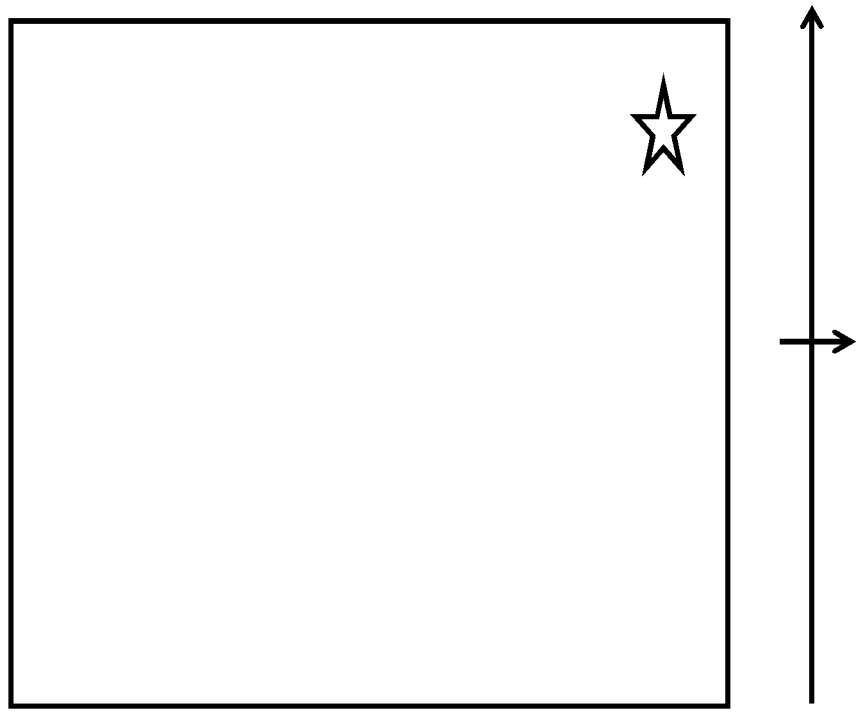
FIG. 5 shows a simplified diagram of a top view of a die with a mark used to indicate the configuration of the strong and weak dipole planes according to an embodiment of the present invention.

FIG. 5 shows a top view of a die with a mark that is used to indicate the configuration of the strong and weak dipole planes according to an embodiment of the present invention. The mark merely serves as indicia and can be of any shape, size, or design. The mark can be either permanent or non-permanent. A permanent mark can be created through any suitable means that does not create defects in the actual LEDs on the die, including but not limited to, lithography, milling, scribing, sawing, laser marking, masking, screen printing, chemical etching during the LED fabrication process. This mark can be placed on any side of any shaped die based on the preference of the manufacturer. In the shown embodiment a star is used to indicate the side of the die that is parallel to the strong dipole plane. Alternatively, a similar mark can be made on the back side of the die to ensure that the LED structure is not altered or damaged in any way. In a specific embodiment, the mark should be larger than about 10 microns, 100 microns, or greater, or large enough to be detectable by a machine reader (e.g., optical, capacitive, inductive, electrical, mechanical or any combination) or visual by a human being assisted with a microscope or under normal vision or other tool. Of course, there can be other variations, modifications, and alternatives.

Figure 6:
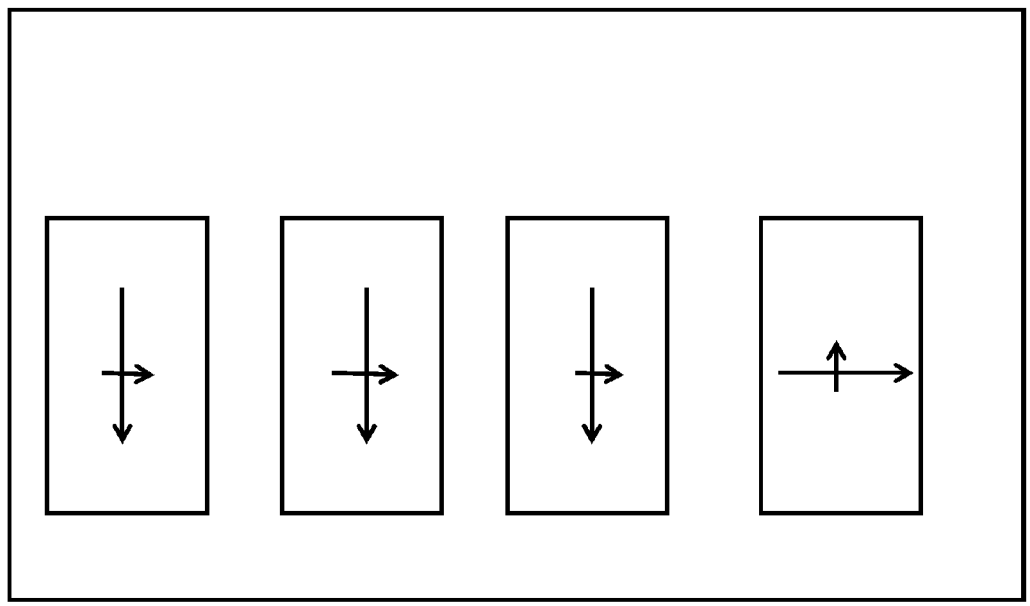
FIG. 6 shows a simplified diagram of a top view of an optical device created with multiple die wherein the configuration of the strong and weak dipole planes of the die are not aligned in the same direction according to an embodiment of the present invention.

FIG. 6 shows a top view of a sample optical device made from multiple die, wherein the configuration of the strong and weak dipole planes of each individual die are not aligned in the same direction according to an embodiment of the present invention. This can dramatically affect the performance of the device, as the light that is emitted from the misaligned die has a different direction of polarization, thereby decreasing the intensity of correctly polarized light that is emitted from the device. This is what creates the need for a method to quickly determine the configuration of the strong and weak dipole planes of the die. Of course, there can be other variations, modifications, and alternatives.

Figure 7:
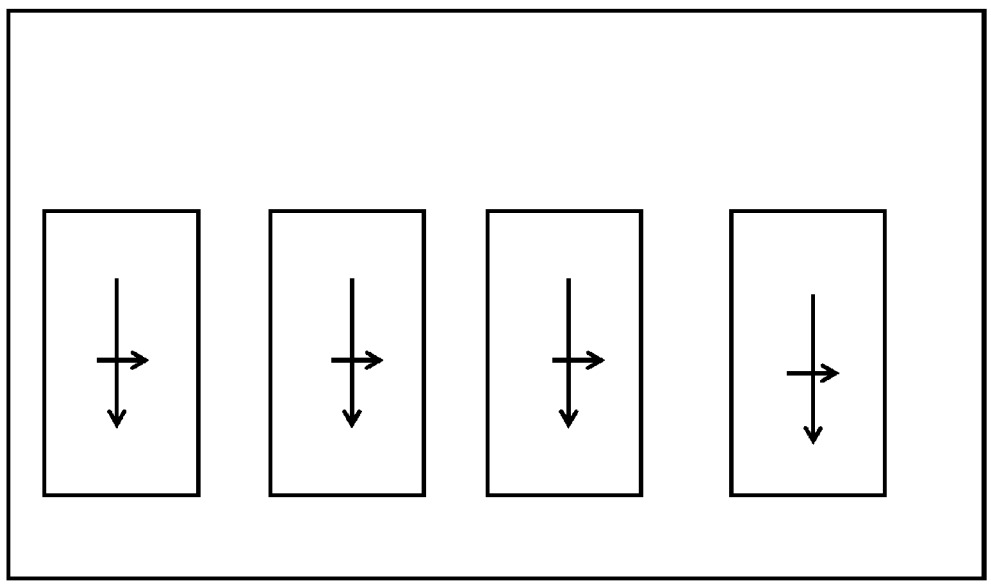
FIG. 7 shows a simplified diagram of a top view of an optical device created with multiple die wherein the configuration of the strong and weak dipole planes of the die are aligned in the same direction according to an embodiment of the present invention.

FIG. 7 shows a top view of a sample optical device made from multiple die, wherein the configuration of the strong and weak dipole planes of each individual die are aligned in the same direction according to an embodiment of the present invention. Using any of the embodiments of this invention, a user can ensure that when packaging multiple die to create an optical device, the die are positioned correctly such that the dipole planes are aligned along the same direction. This in turn ensures that all light is emitted along the same polarized field direction, thereby maximizing light intensity levels.

In some embodiments, at least one light emitting diode is packaged along with at least one phosphor, as described in U.S. patent application 61/086,139, entitled "White light devices using non-polar or semipolar gallium containing materials and phosphors," which is hereby incorporated by reference in its entirety. In other embodiments, at least one textured-surface light emitting diode is co-packaged along with at least one additional light emitting diode, as described in U.S. patent application 61/076,596, entitled "Copackaging configurations for nonpolar GaN and/or semipolar GaN LEDs," which is hereby incorporated by reference in its entirety. Thus, the present invention is not limited to the packaging of identical die fabricated from bulk GaN material. Instead, the present invention can be used with optical devices that utilize die fabricated from various materials. The present invention merely ensures that the manufacturer properly aligns the bulk GaN based die within the optical device.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for indicating a dipole configuration of an LED device provided on a gallium-containing substrate, the method comprising:
   determining a dipole configuration of an LED device provided on a substrate, the LED device being configured to emit electromagnetic radiation having a weak dipole plane and a strong dipole plane; and
   forming one or more indicia on the gallium-containing substrate to correlate the weak dipole plane, the strong dipole plane, or both the weak and the strong dipole plane to the one or more indicia;
   wherein the one or more indicia comprises a shape including a width and a length, the width (W) and the length (L) being different in magnitude, wherein the shape is similar to a rectangular shape in which one side is cut at an angle.

2. The method of claim 1, wherein the one or more indicia comprises one or more marks on either of one of the faces of the device or substrate.

3. The method of claim 1, wherein the weak dipole plane is orthogonal to the strong dipole plane, the strong dipole plane being parallel or perpendicular to the width of the gallium-containing substrate.

4. The method of claim 1, wherein the gallium-containing substrate comprises a gallium species and a nitrogen species.

5. The method of claim 1, wherein the gallium-containing substrate is a gallium nitride (GaN) substrate.

6. The method of claim 5, wherein the GaN substrate comprises a semipolar GaN substrate.

7. The method of claim 5, wherein the GaN substrate comprises a non-polar GaN substrate.

8. The method of claim 1, wherein the length and the width are characterized by an aspect ratio (L/W) of 1.5 and greater.

9. The method of claim 1, wherein the length and the width are characterized by an aspect ratio (L/W) of 2 and greater.

10. The method of claim 1, wherein the LED device is formed on a semi-polar plane of the gallium-containing substrate.

11. The method of claim 1, wherein the LED device is formed on a non-polar plane of the gallium-containing substrate.

12. The method of claim 1, wherein the gallium-containing substrate is characterized by a wurtzite crystalline structure.

13. A method for indicating a dipole configuration of a plurality of LED devices provided on a gallium-containing substrate, the method comprising:
   determining a dipole configuration of each of the plurality of LED devices, each of the plurality of LED devices being configured to emit electromagnetic radiation having a weak dipole plane and a strong dipole plane; and
   cutting one or more of the plurality of LED devices to provide one or more indicia on the gallium-containing substrate to correlate the weak dipole plane, the strong dipole plane, or both the weak and the strong dipole plane to the one or more indicia;
   wherein the one or more indicia comprises a shape including a width and a length, the width (W) and the length (L) being different in magnitude, wherein the shape is similar to a rectangular shape in which one side is cut at an angle.

14. The method of claim 13, wherein each of the plurality of LED devices is configured to emit the polarized electromagnetic radiation in a common direction.

15. The method of claim 13, wherein the weak dipole plane is orthogonal to the strong dipole plane, the strong dipole plane being parallel or perpendicular to the width of the gallium-containing substrate.

16. The method of claim 13, wherein the gallium-containing substrate comprises a gallium species and a nitrogen species.

17. The method of claim 13, wherein the LED device is formed on a semi-polar plane of the gallium-containing substrate.

18. The method of claim 13, wherein the LED device is formed on a non-polar plane of the gallium-containing substrate.

19. A method of assembling an optical device from a plurality of LED devices, comprising:
   providing a plurality of LED devices wherein,
      each of the plurality of LED devices is provided on a gallium-containing substrate and is configured to emit electromagnetic radiation having a weak dipole plane and a strong dipole plane; and
      each of the plurality of LED devices comprises one or more indicia on the gallium-containing substrate to correlate the weak dipole plane, the strong dipole plane, or both the weak and the strong dipole plane to the one or more indicia;
      wherein the one or more indicia comprises a shape including a width and a length, the width (W) and the length (L) being different in magnitude, wherein the shape is similar to a rectangular shape in which one side is cut at an angle; and
   orienting each of the plurality of LED devices based on the one or more indicia.

* * * * *